United States Patent
Wang et al.

(10) Patent No.: US 10,476,485 B2
(45) Date of Patent: Nov. 12, 2019

(54) LESS-IMPACTING CONNECTED MODE MOBILITY MEASUREMENT

(71) Applicant: Verizon Patent and Licensing Inc., Basking Ridge, NJ (US)

(72) Inventors: Xin Wang, Morris Plains, NJ (US); Lily Zhu, Parsippany, NJ (US); Andrew E. Youtz, Princeton, NJ (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 0 days.

(21) Appl. No.: 15/477,196

(22) Filed: Apr. 3, 2017

(65) Prior Publication Data
US 2018/0287591 A1 Oct. 4, 2018

(51) Int. Cl.
| | |
|---|---|
| *H03J 7/18* | (2006.01) |
| *H03J 9/00* | (2006.01) |
| *H04W 56/00* | (2009.01) |
| *H04B 1/401* | (2015.01) |
| *H04W 36/00* | (2009.01) |
| *H04B 1/10* | (2006.01) |
| *H04W 8/24* | (2009.01) |
| *H04W 36/30* | (2009.01) |

(52) U.S. Cl.
CPC ............... *H03J 7/183* (2013.01); *H03J 9/002* (2013.01); *H04B 1/401* (2013.01); *H04W 36/0088* (2013.01); *H04W 56/0045* (2013.01); *H04B 2001/1054* (2013.01); *H04W 8/24* (2013.01); *H04W 36/0058* (2018.08); *H04W 36/30* (2013.01)

(58) Field of Classification Search
CPC ............... H04J 11/0079; H04J 11/0073; H04J 11/0076; H04J 11/00; H04J 11/005; H04J 11/0069; H04J 2011/0003; H04J 2011/0096
USPC ........................................................ 455/154.1
See application file for complete search history.

(56) References Cited

U.S. PATENT DOCUMENTS

| | | | |
|---|---|---|---|
| 2013/0223256 A1* | 8/2013 | Choi ..................... | H04W 24/00 370/252 |
| 2015/0126206 A1* | 5/2015 | Krishnamurthy ..... | H04W 76/18 455/452.1 |
| 2017/0201989 A1* | 7/2017 | Fakoorian ............. | H04L 5/0048 |
| 2018/0063746 A1* | 3/2018 | Anchan ................. | H04W 28/06 |
| 2018/0103433 A1* | 4/2018 | Li ......................... | H04W 52/325 |

* cited by examiner

*Primary Examiner* — Ajibola A Akinyemi

(57) ABSTRACT

A method, apparatus, and system for lessening impact of connected mode mobility measurement is disclosed. A user equipment (UE) may reduce network management complexity by autonomously collecting signal quality measurements for neighboring cells. By autonomously tuning at opportune times for the UE, signal quality measurements may be obtained and reported to a serving cell. In another implementation, the UE examines the broadcast system information of both the serving base station against that of the neighboring base stations. Based on the included bandwidth information, the UE selects appropriate narrowband radio frequency subcarriers to perform signal quality measurement.

20 Claims, 6 Drawing Sheets

LESS-IMPACTING CONNECTED MODE MOBILITY MEASUREMENT

BACKGROUND

A Category M1 (Cat-M1) Long Term Evolution (LTE) user equipment (UE) category was created to support Internet of Things (IoT) use cases with lower data rate, higher coverage and capacity. IoT includes both fixed and mobile use cases, which is one of the major differences between Cat-M1 and narrowband IoT (NB-IoT). Both Cat-M1 and NB-IoT UEs may be categorized as "narrowband UEs," as they use only a portion or subset of a total radio frequency (RF) bandwidth offered by a cell, and use a significantly narrower RF bandwidth than traditional UEs, such as LTE Cat-1+ UEs. For example, a cell may be operated with a 10 MHz or 20 MHz total bandwidth, much or all of which (for example, 10 MHz or 20 MHz) may be used by an LTE Cat-1+ UE for communications. However, a Cat-M1 UE instead only makes use of 1.4 MHz of that total bandwidth at any given time. In many implementations, a narrowband radio transceiver included in a narrowband UE is limited to operating with this narrower RF bandwidth, and cannot operate using the full bandwidth offered by a cell.

For narrowband UEs that change locations or require mobility, lack of connected mode mobility support will cause dragging; produce interference to non-narrowband UEs, which may be running critical applications such as Voice Over LTE (VoLTE) in neighboring cells; and longer interruptions to narrowband devices. Due to only being able to use a subset or portion of a total RF bandwidth offered by a cell, narrowband UEs generally cannot use the same techniques for connected mode mobility that are used by traditional UEs. For example, a Cat-M1 UE needs to tune away from its allocated PDSCH physical resource blocks (PRBs) to a center six PRBs (located at different subcarrier frequencies than the allocated PDSCH) to receive and process primary synchronization signals (PSS) and secondary synchronization signals (SSS), and perform reference signal received power (RSRP) measurement on a cell-specific reference signal (CRS) transmitted by a neighbor cell. A period of time that a UE must tune away from its current connection with a serving cell to measure signals from neighboring cells is referred to as a "measurement gap." For Cat-1+ UEs, only inter-frequency handover (HO) requires use of a measurement gap. However, according to the Cat-M1 standard, a measurement gap is required for all HOs, including intra-frequency HOs. Measurement gap requires UEs to tune away from their assigned PRBs, thereby interrupting communications.

In some networks or network architectures, serving cells are expected to schedule measurement gaps for, and communicate such schedules to, their connected UEs. However, as narrowband UEs providing connected mode mobility are further deployed, the scheduling demands for serving cells continue to grow. For example, a single base station could be required to perform measurement gap scheduling activities for thousands of connected narrowband UEs. These scheduling activities are burdensome computationally and interrupt other communication activities.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

A narrowband UE may reduce network scheduling and management complexity by autonomously obtaining signal quality measurements for neighboring cells that may be provided to and used by the network for making handover determinations. Neighboring cells may be intra-base station and inter-base station. By autonomously tuning at opportune times for the UE, the cell reference signals (CRS) may be measured and reported to a serving base station. This aids the serving base station in its determination for handover of the UE to a neighboring cell and may reduce or eliminate the need for the network to schedule gap measurement activities for the narrowband UE.

Figure 1:
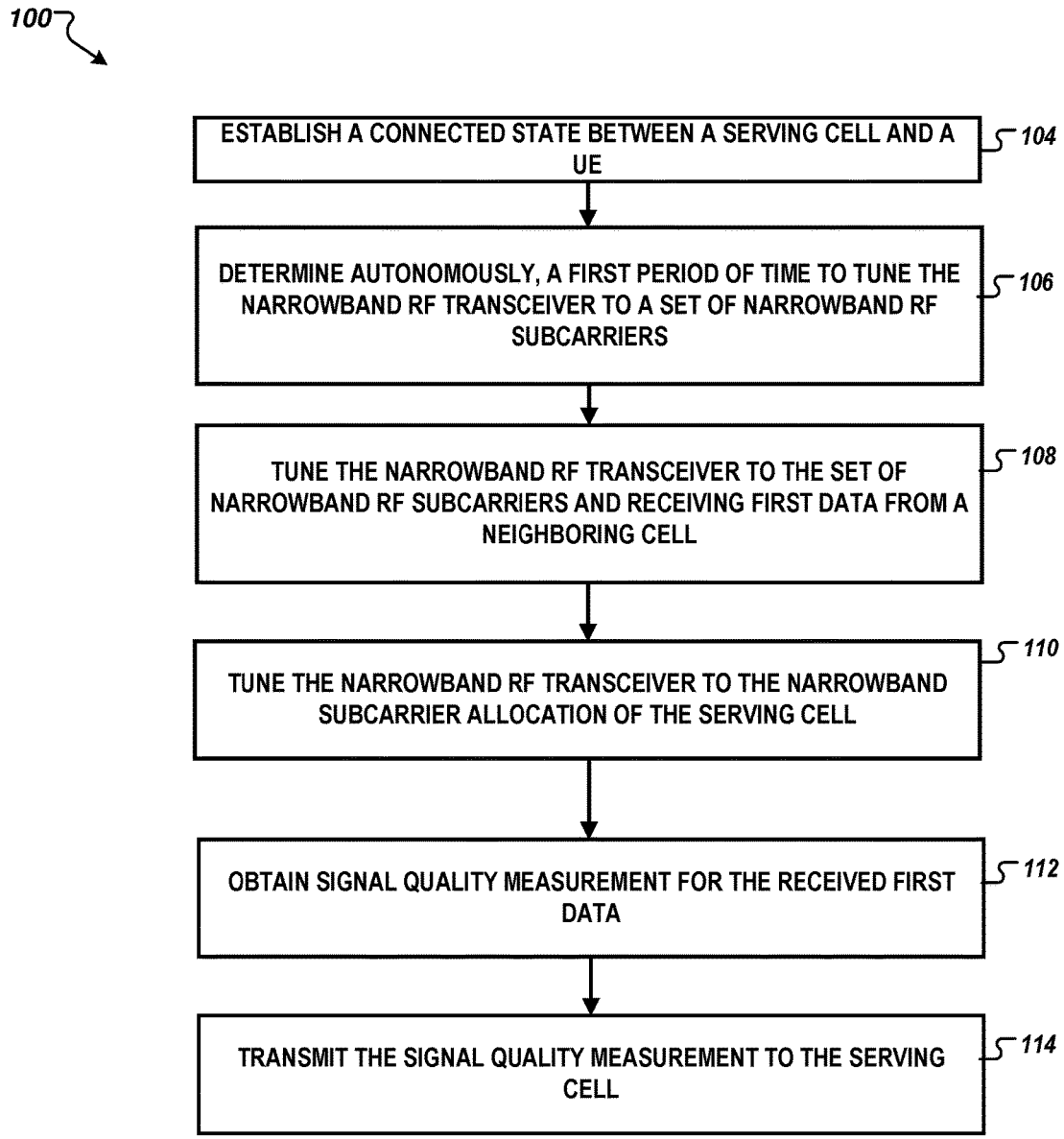
FIG. 1 illustrates a flow chart of an example process for autonomously collecting signal measurements of neighboring base stations.

FIG. 1 illustrates a flow chart 100 of an example process for autonomously collecting signal measurements of neighboring cell. A connected state between a serving cell and a narrowband user equipment (UE) may be established (Step 104). The connected state may be established via a set of narrowband subcarrier allocated by the serving cell. For example, on a Cat-M1 network, the allocation may be made via the reception of MTC Physical Downlink Control Channel (MPDCCH) messaging. The narrowband subcarrier allocation may take the form of physical resource blocks (PRBs). The narrowband subcarrier allocation may identify a block of narrowband range of radio frequency (RF) subcarriers or PRBs within the total complement of RF subcarriers the serving cell is capable of addressing. The total bandwidth for the narrowband subcarrier allocation is less than the total bandwidth for subcarriers on the serving cell. For example, on a Cat-M1 network, the total bandwidth for the narrowband subcarrier allocation for a narrowband UE is 1.4 MHz narrowband, whereas the total bandwidth for the subcarriers on the serving cell might be, for example, 3, 5, 10, 15, or 20 MHz.

Continuing the establishing of a RF connection, the narrowband UE may tune a narrowband RF transceiver included therein, in response to receiving the narrowband subcarrier allocation from the serving cell. The narrowband UE may utilize the subcarrier allocation from MPDCCH messaging to determine the expected subcarriers to communicate with the serving cell. For some narrowband UE's this may include the utilization of up to six PRBs, throughout the full superset of PRBs allocable by the serving cell.

The narrowband UE may include, for example, any IoT device, including sensors, wearables, and general computing devices. On an LTE-based network, a cell may include, for example, a base station built around an eNodeB, or any other LTE network element capable of managing many narrowband UEs. On LTE, including Cat-M1, the UE may associate with the serving cell by receiving broadcast system information messages including Master Information Blocks (MIBs) and System Information Blocks (SIBs). The MIBs and SIBs provide the information necessary for the UE to initially connect and stay connected to a cell.

A narrowband UE may need to do signal measurement of neighboring cells to determine when handover (HO) is necessary. The narrowband UE autonomously determines a period of time to tune the narrowband RF transceiver to a different set of narrowband RF subcarriers (Step 106). The measurement may include the narrowband UE tuning to the center six PRBs, extracting a primary synchronization signal, extracting a secondary synchronization signal, and determining the physical cell identity of the neighboring cell. Alternatively, the UE may receive a physical cell identity (PCI) for one or more neighboring cells via a broadcast system information message. A LTE example of a broadcast system information message may include a SIB4 (System Information Block Type 4) message. The serving cell may identify neighbor cells not supporting Cat-M1 in a blacklist included in an SIB4 message. In other implementations in which SIB4 messages are not received, the UE may read an MIB of the neighbor cells to determine if the cells support Cat-M1, thereby abbreviating the number of neighboring cells to analyze. Once the physical cell identity is determined, the narrowband UE may determine the cell specific reference signal (CRS) and utilize reference signal received power (RSRP) messaging to determine signal measurement of the neighboring cell. The period of time to tune may be determined by the narrowband UE based on the current processing state. In some implementations, the narrowband UE tunes away from its allocated PRBs to the center six PRBs, when a long repetition sequence is completed. This allows the narrowband UE to complete the computation task of receiving the sequence, without the need to tune away before the sequence is complete. In the case that the narrowband UE was instructed to perform measurement gap activities by the serving cell, the period of time may be set by the serving cell, irrespective of the computational task the narrowband UE is performing.

While the narrowband UE remains associated to the serving cell, the narrowband UE tunes the narrowband RF transceiver to a set of narrowband RF subcarriers (Step 108). The set of narrowband RF subcarriers may include the six center PRBs of a neighboring cell. The tuning allows the narrowband UE to receive signals from the neighboring cell. As mentioned previously, the narrowband UE utilizes these signals to identify the neighboring cell and then performs signal measurement. The narrowband UE stores the subcarrier allocation which was being utilized when communicating with the serving cell, so that the narrowband UE may maintain the association with the serving cell.

The narrowband UE tunes the narrowband RF transceiver to subcarrier allocation of the serving cell in order to exchange data via RF with the serving cell (Step 110). The narrowband UE tunes to the previously stored allocation of subcarriers to continue to maintain the association between itself and the mobile base station. Consequently, the narrowband UE does not need to reassociate with the mobile base station.

The narrowband UE obtains signal quality measurement for the received RF data from the neighboring cell (Step 112). Example signal quality measurements include, but are not limited to, SINR (signal to interference plus noise ratio), RSRP (reference signal received power), RSRQ (reference signal received quality), SNR (signal to noise ratio), RSSI (received signal strength indication), CIR (carrier to interference ratio), CINR (carrier to interference plus noise ratio), BER (bit error rate), SER (symbol error rate), FER (frame error rate), CQI (channel quality indicator), and RSCP (received signal code power), or a signal quality measurement generated based on one or more of such signal quality measurements. Once the narrowband UE has tuned to the serving cell, the narrowband UE may analyze the received signal quality measurement. This minimizes the amount of time the narrowband UE is tuned away from the serving cell. Additionally, this allows the narrowband UE to schedule the analysis based on priority of other computational tasks.

The narrowband UE transmits the signal quality measurement to the serving cell (Step 114). By providing the serving cell with the signal quality measurement of the neighboring cell, the decision to handover the narrowband UE from the serving cell to the neighboring cell may be determined. Utilizing this process, the serving cell is supplied with the needed signal quality measurement without the scheduling overhead, and the process allows the narrowband UE to more efficiently retrieve the signal quality measurement without interruption of other computing tasks.

Figure 2:
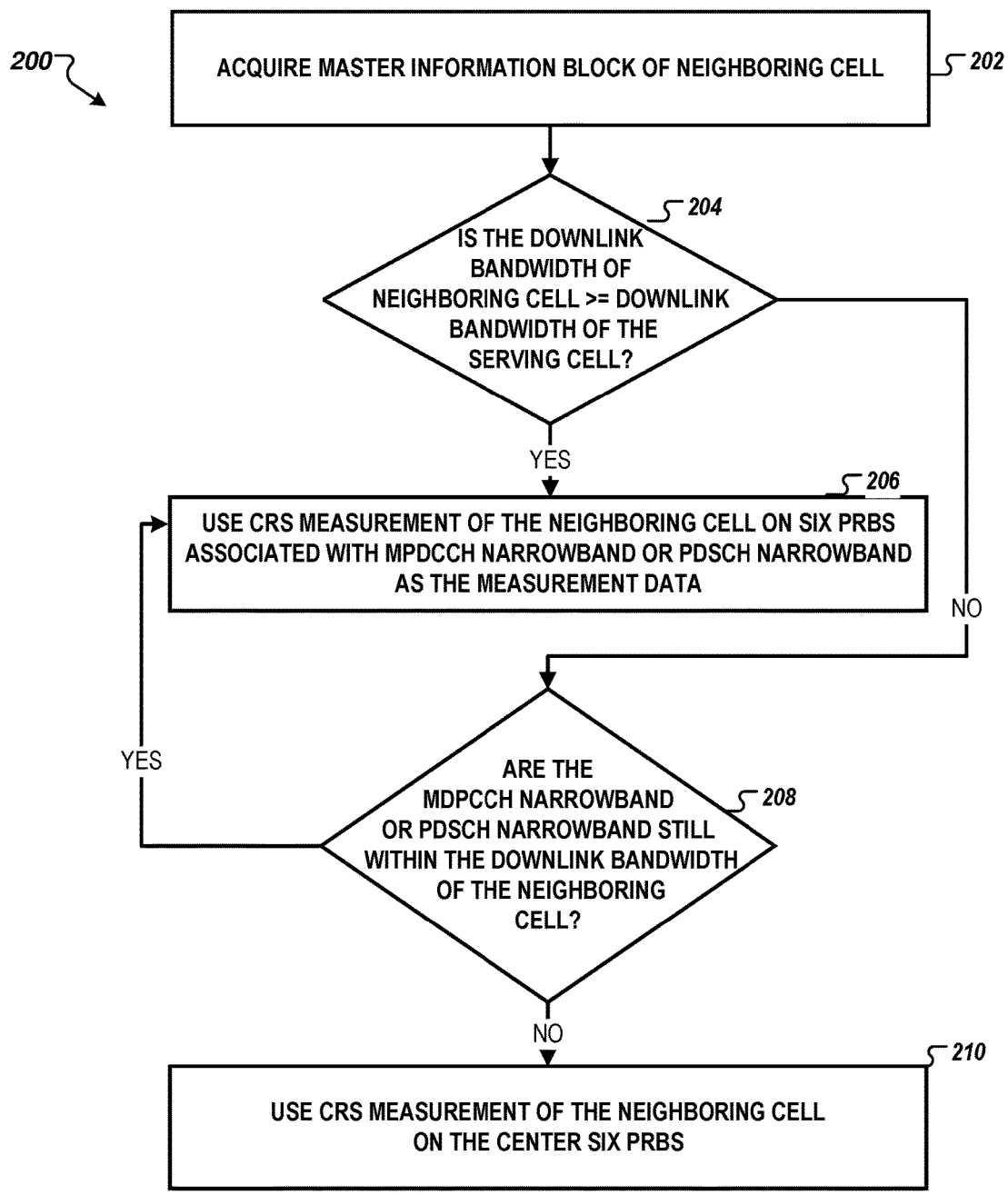
FIG. 2 illustrates a flow chart of an example process for selecting physical resource blocks for CRS measurement.

FIG. 2 illustrates a flow chart 200 of an example process for selecting physical resource blocks for CRS measurement. Similar to the process described in FIG. 1, the flow chart 200 demonstrates an alternative method of obtaining the signal quality measurement. The steps described in flow chart 200 present augmentation for Step 112. Although FIG. 2 illustrates an example process for obtaining signal quality measurements applicable on an LTE and/or Cat-M1 based network, it is understood that similar techniques may be used by narrowband UEs for connected mode mobility measurements via other network technologies or protocols.

While the narrowband UE is tuned the narrowband RF transceiver to the center six PRBs, the narrowband UE may acquire MIB of neighboring cell (Step 202) The MIB contains information relevant to system bandwidth and frame timing. The system bandwidth information is useful to the narrowband UE, as it will allow the narrowband UE to better target where to take a signal quality measurement.

The narrowband UE then determines if the neighboring cell is utilizing the same subcarriers as the serving cell as to limit any need to retune the RF transceiver. On an LTE-based system this may be achieved when the narrowband UE determines whether the downlink bandwidth of neighboring cell is greater than or equal to the downlink bandwidth of the serving cell (Step 204). As the narrowband UE now has acquired both MIBs for the serving cell and the neighboring cell, the narrowband UE may evaluate the two using similar metrics. The narrowband UE may compare the respective downlink bandwidth values using simple comparison operators.

If the downlink bandwidth of the neighboring cell is greater than or equal to that of the serving cell (Step 204, YES), the narrowband UE may select the CRS measurement of the neighboring cell on the six PRBs associated with MTC physical downlink control channel (MPDCCH) narrowband or physical downlink shared channel (PDSCH) narrowband (Step 206).

If the downlink bandwidth of the neighboring cell is smaller than that of the serving cell (Step 204, NO), the narrowband UE may evaluate if the MDPCCH narrowband or PDSCH narrowband are still within the downlink bandwidth of the neighboring cell (Step 208).

If the MDPCCH narrowband or PDSCH narrowband are still within the downlink bandwidth of the neighboring cell (Step 208, YES), the narrowband UE may use CRS measurement of the neighboring cell on the six PRBs associated with MPDCCH narrowband or PDSCH narrowband as the measurement data (Step 206).

If the MDPCCH narrowband or the PDSCH narrowband are not within the downlink bandwidth of the neighboring cell (Step 208, NO), the narrowband UE may use CRS measurement of the neighboring cell on the center six PRBs as the measurement data (Step 210).

Figure 3:
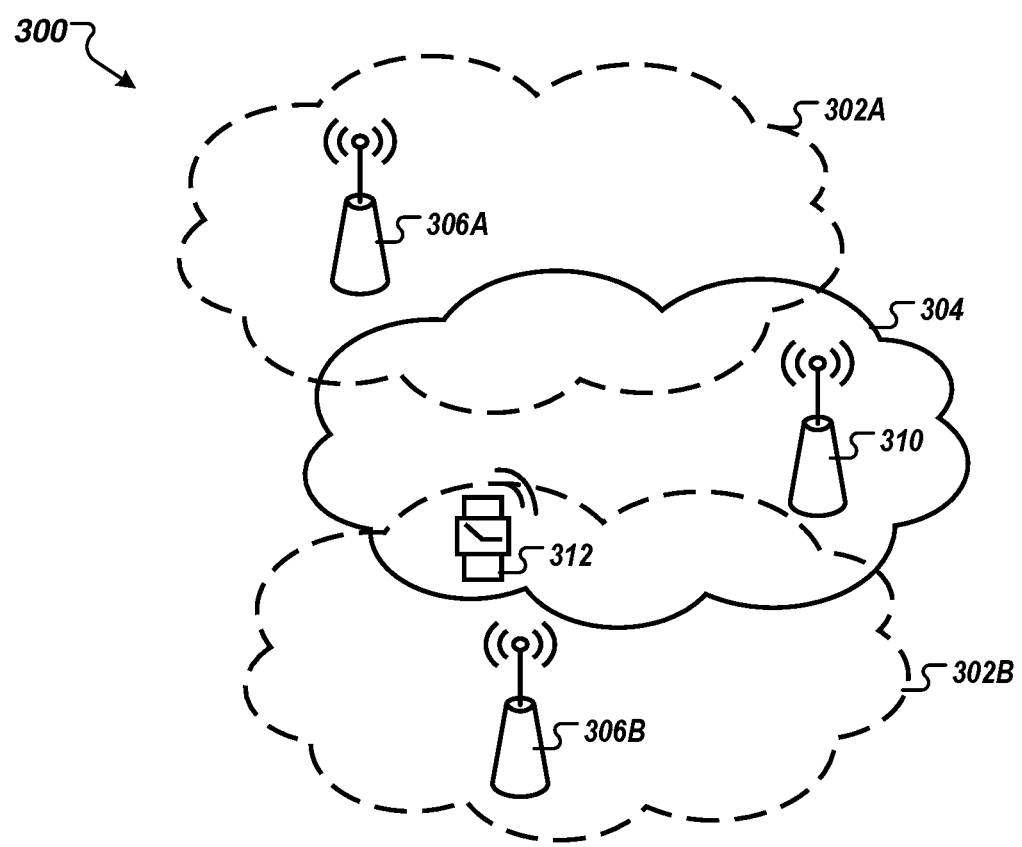
FIG. 3 illustrates an example network diagram of device narrowband UE operating on a cell network.

FIG. 3 illustrates an example network diagram 300 of a narrowband UE operating on a cell network. Illustrated in the network diagram 300 are three base stations: two base stations are neighboring base stations 306A,306B and one serving base station 310. A narrowband UE 312, illustrated in FIG. 3 as a cell connected watch, is connected with the serving base station 310. Indicated by the serving base station signal propagation cloud 304.

The cellular network may include some overlap between the serving base station signal propagation cloud 304 and neighboring base station signal propagation clouds 302A, 302B. In the areas where overlap is present, gap measurement becomes necessary to facilitate appropriate HO for the narrowband UE 312. In this example, the narrowband UE 312 is traversing the serving base station signal propagation cloud 304 into the neighboring base station signal propagation cloud 302B. The narrowband UE 312 may autonomously determine the signal quality of the neighboring base station 306B utilizing the steps shown in FIGS. 1 and 2. Alternatively in some implementations the narrowband UE 312 may evaluate the neighboring signal utilizing traditional gap measurement processes, which include scheduling of time periods for measurement gaps by the serving base station 310.

In some implementations, the serving base station 310 does not schedule periods of time for the narrowband UE 312 to perform gap measurement, allowing the serving base station 310 to be relieved of the processing complexity of measurement gap scheduling and using bandwidth to communicate the resulting schedules. The narrowband UE 312 may, via a capability flag or other indicator transmitted to the serving base station 310, indicate that the narrowband UE 312 is operable to perform autonomous gap measurement, and thereby does not require scheduling. In response to receiving such an indication, the serving base station 310 may be configured to selectively disable scheduling measurement gaps for the narrowband UE 312.

Figure 4:
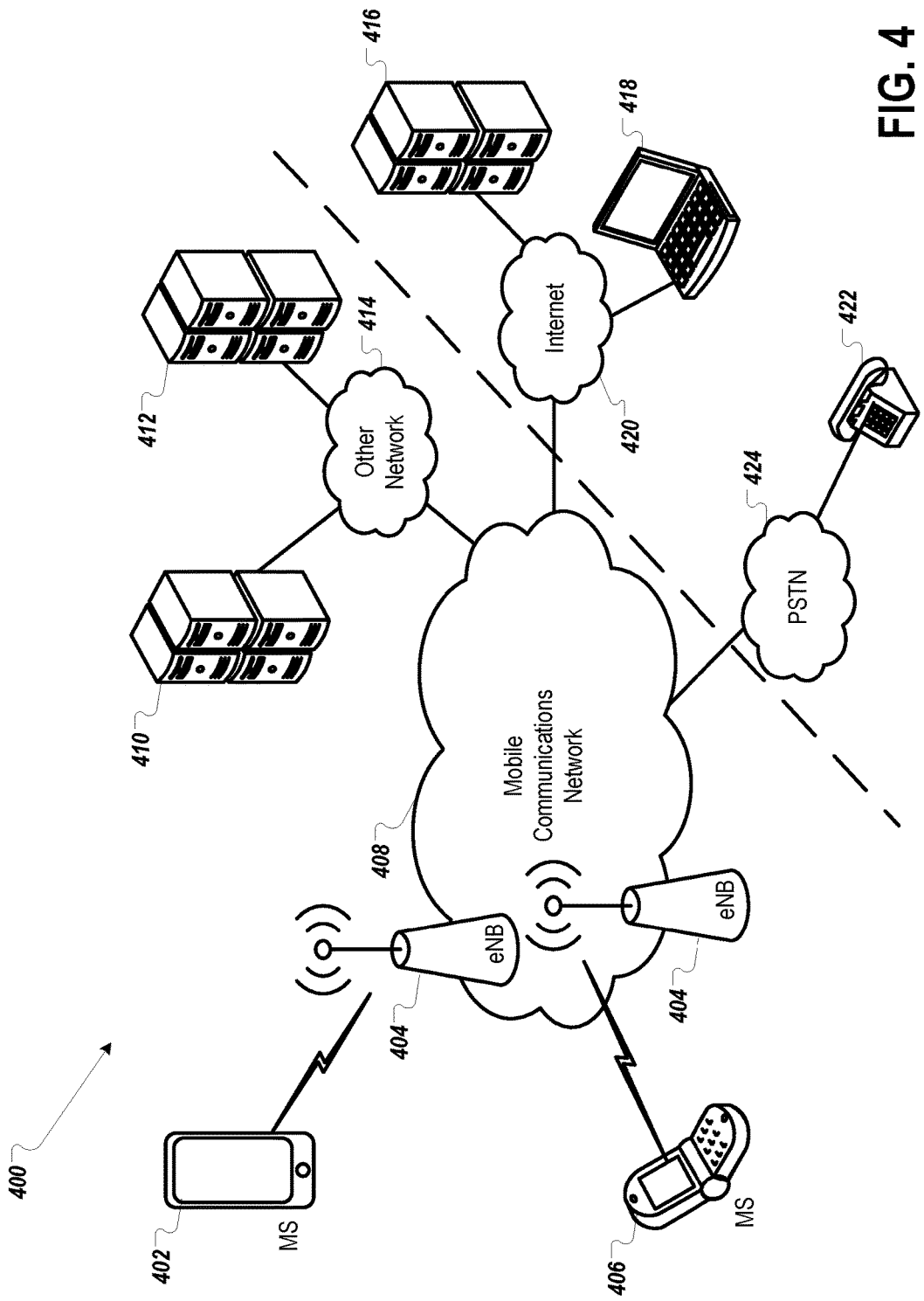
FIG. 4 illustrates a high-level functional block diagram of an example system of networks/devices that provide various communications for mobile stations.

FIG. 4 illustrates an example system 400 offering a variety of mobile communication services in a mobile network where narrowband UEs may utilize autonomous gap measurement. The example of FIG. 4 shows two mobile stations (MSs) 402 and 406, which may include narrowband UEs, as well as a mobile communication network 408. Mobile stations 402 and 406 may also be interpreted as mobile devices or UEs, including narrowband UEs. The network 408 provides mobile wireless communications services to those stations as well as to other mobile stations (not shown), for example, via a number of base stations (BS) 404. The mobile stations 402 and 406 may be configured to implement the process for autonomous gap measurement. The present techniques may be implemented in or used in any of a variety of available mobile networks 408, and the drawing shows only a very simplified example of a few relevant elements of the network 408 for purposes of discussion here.

The wireless mobile communication network 408 might be implemented as a network conforming to the LTE standard, the code division multiple access (CDMA) IS-95 standard, the 3rd Generation Partnership Project 2 (3GPP2) wireless IP network standard or the Evolution Data Optimized (EVDO) standard, the Global System for Mobile (GSM) communication standard, a time division multiple access (TDMA) standard, the Universal Mobile Telecommunications System (UMTS) standard, the LTE standard belonging to 3GPP or other standards used for public mobile wireless communications. The mobile stations 402 and 406 may be capable of voice telephone communications through the network 408. Alternatively or additionally, the mobile stations 402 and 406 may be capable of data communications through the particular type of network 408 (and the users thereof typically will have subscribed to data service through the network).

The wireless mobile communications network 408 allows users of the mobile stations such as 402 and 406 (and other mobile stations not shown) to initiate and receive telephone calls to each other as well as through the public switched telephone network or "PSTN" 424 and telephone stations 422 connected to the PSTN. The network 408 typically offers a variety of data services via the Internet 420, such as downloads, web browsing, email, etc. By way of example, the drawing shows a laptop PC type user terminal 418 as well as a server 416 connected to the Internet 420; and the data services for the mobile stations 402 and 406 via the Internet 420 may be with devices like those shown at 416 and 418 as well as with a variety of other types of devices or systems capable of data communications through various interconnected networks.

Mobile stations 402 and 406 can take the form of portable handsets, smart-phones, personal digital assistants, sensors, and automatons. Program applications can be configured to execute on many different types of mobile stations 402 and 406. For example, a mobile station application can be written to execute on a binary runtime environment for mobile (BREW-based) mobile station, a Windows Mobile based mobile station, Android, I-Phone, Java Mobile, or RIM based mobile station such as a BlackBerry or the like. Some of these types of devices can employ a multi-tasking operating system.

The mobile communication network 400 can be implemented by a number of interconnected networks. Hence, the overall network 400 may include a number of radio access networks (RANs), as well as regional ground networks interconnecting a number of RANs and a wide area network (WAN) interconnecting the regional ground networks to core network elements. A regional portion of the network 400, such as that serving mobile stations 402, 406, can include one or more RANs and a regional circuit and/or packet switched network and associated signaling network facilities.

Physical elements of a RAN operated by one of the mobile service providers or carriers, include a number of base stations represented in the example by the base stations (BSs) 404. Although not separately shown, such a base station 404 can include a base transceiver system (BTS), which can communicate via an antennae system at the site of base station and over the airlink with one or more of the mobile stations 402 and 406, when the mobile stations are within range. Base stations 404 may include eNodeBs in a LTE mobile network. Each base station can include a BTS coupled to several antennae mounted on a radio tower within a coverage area often referred to as a "cell." The BTS is the part of the radio network that sends and receives RF signals to/from the mobile stations 402 and 406 that are served by the base station 404.

The radio access networks can also include a traffic network represented generally by the cloud at 408, which carries the user communications and data for the mobile stations 402 and 406 between the base stations 404 and other elements with or through which the mobile stations communicate. The network can also include other elements that support functionality other than device-to-device media transfer services such as messaging service messages and voice communications. Specific elements of the network 408 for carrying the voice and data traffic and for controlling various aspects of the calls or sessions through the network 408 are omitted here form simplicity. It will be understood that the various network elements can communicate with each other and other aspects of the mobile communications network 400 and other networks (e.g., the public switched telephone network (PSTN) and the Internet) either directly or indirectly.

The carrier will also operate a number of systems that provide ancillary functions in support of the communications services and/or application services provided through the network 400, and those elements communicate with other nodes or elements of the network 400 via one or more private IP type packet data networks 414 (sometimes referred to as an Intranet), i.e., private networks. Generally, such systems are part of or connected for communication via the private network 414. A person skilled in the art, however, would recognize that systems outside of the private network could serve the same functions as well. Examples of such systems, in this case operated by the network service provider as part of the overall network 400, which communicate through the intranet type network 414, include one or more application servers 410 and a related authentication server 412 for the application service of server 410. As illustrated in FIG. 4, the servers 416 and 410 may communicate with one another over one or more networks.

The mobile stations 402 and 406 communicate over the air with a base station 404. The mobile stations 402 and 406 communicate through the traffic network 408 for various voice and data communications, e.g. through the Internet 420 with a server 416 and/or with application servers 410. Services offered by the mobile service carrier may be hosted on a carrier operated application server 410, for communication via the networks 408 and 414. Server such as 416 and 410 may provide any of a variety of common application or service functions in support of or in addition to application programs running on the mobile stations 402 and 406. For a given service, an application program within the mobile station may be considered as a 'client' and the programming at 416 or 410 may be considered as the 'server' application for the particular service.

To ensure that the application service offered by server 410 is available to only authorized devices/users, the provider of the application service also deploys an authentication server 412. The authentication server 412 could be a separate physical server as shown, or authentication server 412 could be implemented as another program module running on the same hardware platform as the server application 412. Essentially, when the server application (server 412 in our example) receives a service request from a client application on a mobile station, such as mobile stations 402 and 406, the server application provides appropriate information to the authentication server 412 to allow server application 412 to authenticate the mobile station 402, 406 as outlined herein. Upon successful authentication, the server 412 informs the server application 410, which in turn provides access to the service via data communication through the various communication elements (e.g. 414, 408 and 404) of the network 400.

As shown by the above discussion, functions relating to voice and data communication may be implemented on computers connected for data communication via the components of a packet data network, as shown in FIG. 4. Although special purpose devices may be used, such devices also may be implemented using one or more hardware platforms intended to represent a general class of data processing device commonly used to run "server" programming so as to implement the functions discussed above, albeit with an appropriate network connection for data communication.

Figure 5:
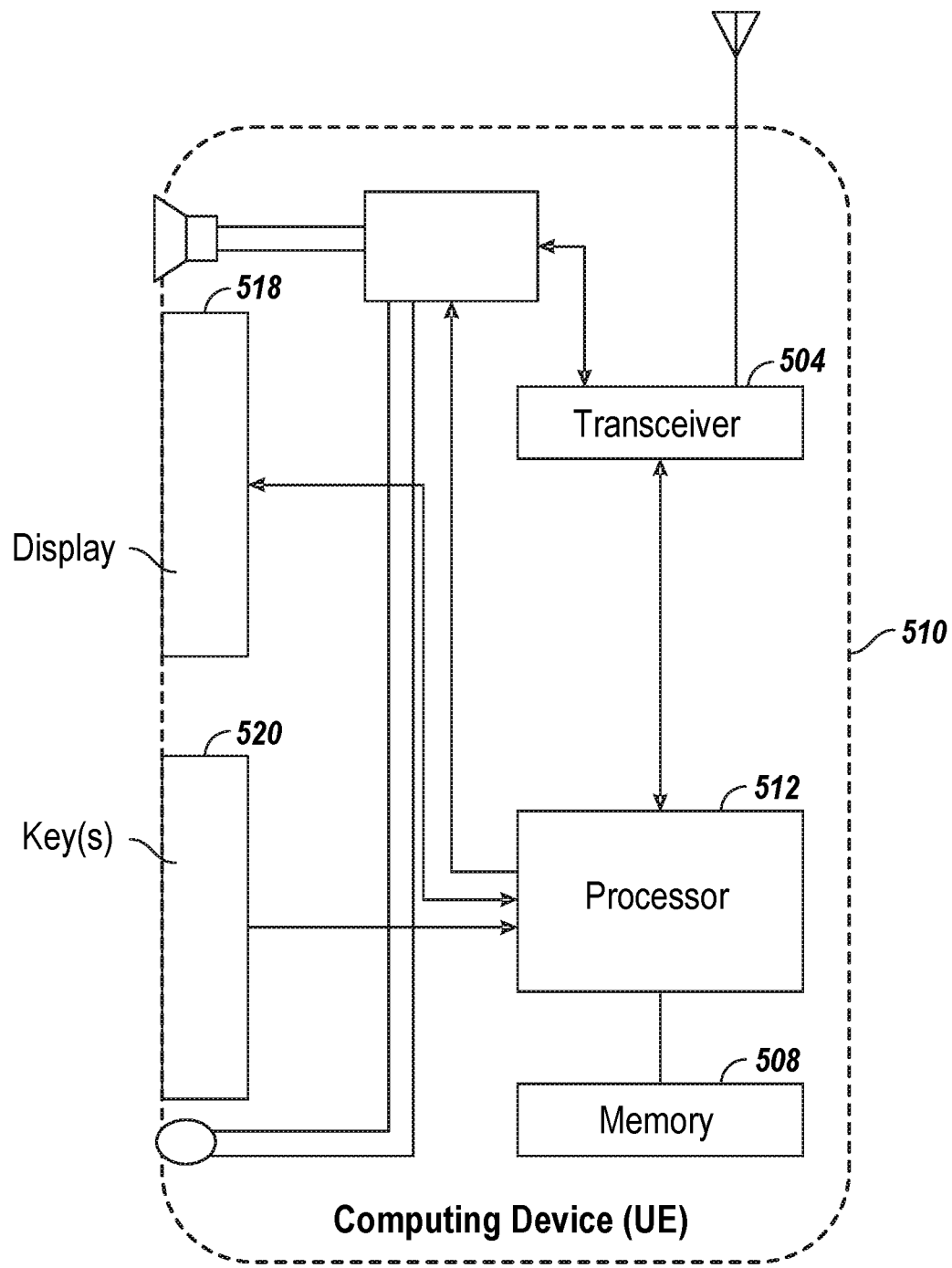
FIG. 5 is a high-level functional block diagram illustrating an example of a computing device for enabling less-impacting mobility measurement for narrowband user equipment.

FIG. 5 is a high-level functional block diagram illustrating an example of a UE 510 for enabling less-impacting mobility measurement for narrowband user equipment. The computing device, or UE, 510, is not particularly limited to a specific type of device, but may include any computing device capable of connecting to a mobile communications network, such as mobile communications network 408 illustrated in FIG. 4. Examples of UE 510 may include, but are not limited to, a smartphone, a tablet, a basic phone such as a flip-top phone, a laptop or other computer, a motor vehicle with cellular communication capabilities, and IoT devices. The UE 510 may be configured for digital wireless communications using one or more of the common network technology types.

As illustrated in FIG. 5, the UE 510 may include a transceiver 504, a memory 508, and at least one processor 512. The transceiver 504 may be configured to transmit or receive data. The concepts discussed here encompass embodiments of UE 510 utilizing any digital transceivers that conform to current or future developed digital wireless communication standards. The UE 510 may also be capable of analog operation via a legacy network technology.

The memory 508 may be configured to store the data transmitted or received via the transceiver 504 or from an external source. The UE 510 may include flash type program memory, for storage of various "software" or "firmware" program routines and mobile configuration settings. The UE 510 may also include a random access memory (RAM) for a working data processing memory. Of course, other storage devices or configurations may be added to or substituted.

The processor 512 may be configured to cooperate with the transceiver 504 and the memory 508. In certain implementations, the processor 512 may be a microprocessor. The processor 512 may be further configured to associate the UE 510 to a serving cell, receive narrowband subcarrier allocations via the transceiver 504, tuning to the narrowband subcarrier allocations, autonomously determining an appropriate time and frequencies to tune to a neighboring cell, tuning to the neighboring cell to detect measurement data, returning to the subcarrier allocation of the serving cell, deriving measurement data from the frequencies for measurement, and transmitting the measurement data to the serving cell.

In some implementations, the UE 510 may further include a display 518 for displaying messages, menus or the like, call related information dialed by the user, calling party numbers, etc., including data usage information for various data communications service over the mobile communication network. In some implementations, the UE 510 may further include key(s) 520; for example, to enable providing numeric and/or alphanumeric input as well as generating selection inputs, for example, as may be keyed-in by the user based on a displayed menu or as a cursor control and selection of a highlighted item on a displayed screen. The display 518 and keys 520 may be physical elements providing a textual or graphical user interface. The keys 520 may form part of a keypad. Alternatively, if the UE 510 includes a touch screen, there may be only a single key 520 or a limited number of keys 520.

Figure 6:
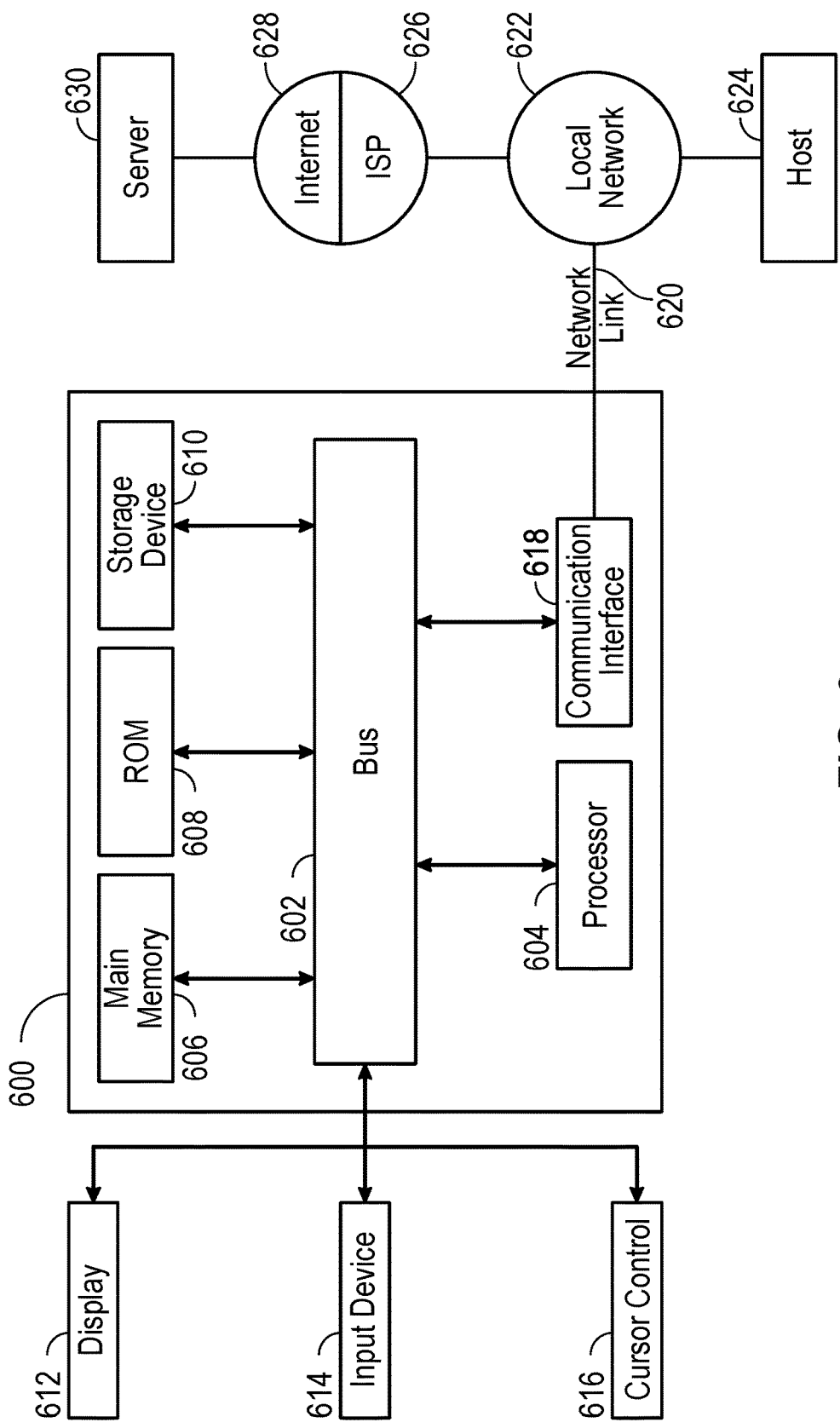
FIG. 6 is a block diagram that illustrates a computer system upon which aspects of this disclosure may be implemented.

FIG. 6 is a block diagram that illustrates a computer system 600 upon which aspects of this disclosure may be implemented, such as, but not limited to, components of base stations 306A and 306B, serving base station 310, narrowband UE 312, and/or UE 510. Computer system 600 includes a bus 602 or other communication mechanism for communicating information, and a processor 604 coupled with bus 602 for processing information. Computer system 600 also includes a main memory 606, such as a random access memory (RAM) or other dynamic storage device, coupled to bus 602 for storing information and instructions to be executed by processor 604. Main memory 606 also may be used for storing temporary variables or other intermediate information during execution of instructions to be executed by processor 604. Computer system 600 further includes a read only memory (ROM) 608 or other static storage device coupled to bus 602 for storing static information and instructions for processor 604. A storage device 610, such as a magnetic disk or optical disk, is provided and coupled to bus 602 for storing information and instructions.

Computer system 600 may be coupled via bus 602 to a display 612, such as a cathode ray tube (CRT), liquid crystal display (LCD) or organic light emitting diodes (OLED) display, for displaying information to a computer user. An input device 614, including alphanumeric and other keys, is coupled to bus 602 for communicating information and command selections to processor 604. Another type of user input device is cursor control 616, such as a mouse, a trackball, or cursor direction keys for communicating direction information and command selections to processor 604 and for controlling cursor movement on display 612. This input device typically has two degrees of freedom in two axes, a first axis (e.g., x) and a second axis (e.g., y), that allows the device to specify positions in a plane. Another type of user input device is a touchscreen, which generally combines display 612 with hardware that registers touches upon display 612.

This disclosure is related to the use of computer systems such as computer system 600 for implementing the techniques described herein. In some examples, those techniques are performed by computer system 600 in response to processor 604 executing one or more sequences of one or more instructions contained in main memory 606. Such instructions may be read into main memory 606 from another machine-readable medium, such as storage device 610. Execution of the sequences of instructions contained in main memory 606 causes processor 604 to perform the process steps described herein. In some examples, hardwired circuitry may be used in place of or in combination with software instructions to implement the various aspects of this disclosure. Thus, implementations are not limited to any specific combination of hardware circuitry and software.

The term "machine-readable medium" as used herein refers to any medium that participates in providing data that causes a machine to operate in a specific fashion. In some examples implemented using computer system 600, various machine-readable media are involved, for example, in providing instructions to processor 604 for execution. Such a medium may take many forms, including but not limited to, non-volatile media, volatile media, and transmission media. Non-volatile media includes, for example, optical or magnetic disks, such as storage device 610. Volatile media includes dynamic memory, such as main memory 606. Transmission media includes coaxial cables, copper wire and fiber optics, including the wires that comprise bus 602. Transmission media can also take the form of acoustic or light waves, such as those generated during radio-wave and infra-red data communications. All such media must be tangible to enable the instructions carried by the media to be detected by a physical mechanism that reads the instructions into a machine.

Common forms of machine-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, and EPROM, a FLASH-EPROM, any other memory chip or cartridge, a carrier wave as described hereinafter, or any other medium from which a computer can read.

Various forms of machine-readable media may be involved in carrying one or more sequences of one or more instructions to processor 604 for execution. For example, the instructions may initially be carried on a magnetic disk of a remote computer. The remote computer can load the instructions into its dynamic memory and send the instructions over a telephone line using a modem. A modem local to computer system 600 can receive the data on the telephone line and use an infra-red transmitter to convert the data to an infra-red signal. An infra-red detector can receive the data carried in the infra-red signal and appropriate circuitry can place the data on bus 602. Bus 602 carries the data to main memory 606, from which processor 604 retrieves and executes the instructions. The instructions received by main memory 606 may optionally be stored on storage device 610 either before or after execution by processor 604.

Computer system 600 also includes a communication interface 618 coupled to bus 602. Communication interface 618 provides a two-way data communication coupling to a network link 620 that is connected to a local network 622. For example, communication interface 618 may include an LTE capable modem to provide a data communication connection to a corresponding type of wireless communication channel. As another example, communication interface 618 may be a local area network (LAN) card to provide a data communication connection to a compatible LAN. Other wireless links may also be implemented. In any such implementation, communication interface 618 sends and receives electrical, electromagnetic or optical signals that carry digital data streams representing various types of information.

Network link 620 typically provides data communication through one or more networks to other data devices. For example, network link 620 may provide a connection through local network 622 to a host computer 624 or to data equipment operated by an Internet Service Provider (ISP) 626. Local network may take the form as a wireless network access point, or mobile base stations. ISP 626 in turn provides data communication services through the world wide packet data communication network now commonly referred to as the "Internet" 628. Local network 622 and Internet 628 both use electrical, electromagnetic or optical signals that carry digital data streams. The signals through the various networks and the signals on network link 620 and through communication interface 618, which carry the digital data to and from computer system 600, are example forms of carrier waves transporting the information.

Computer system 600 can send messages and receive data, including program code, through the network(s), network link 620 and communication interface 618. In the Internet example, a server 630 might transmit a requested code for an application program through Internet 628, ISP 626, local network 622 and communication interface 618.

The received code may be executed by processor 604 as it is received, and/or stored in storage device 610, or other non-volatile storage for later execution. In this manner, computer system 600 may obtain application code in the form of a carrier wave.

To the extent the aforementioned implementations collect, store or employ personal information provided by individuals, it should be understood that such information shall be used in accordance with all applicable laws concerning protection of personal information. Additionally, the collection, storage and use of such information may be subject to consent of the individual to such activity, for example, through well known "opt-in" or "opt-out" processes as may be appropriate for the situation and type of information. Storage and use of personal information may be in an appropriately secure manner reflective of the type of information, for example, through various encryption and anonymization techniques for particularly sensitive information.

These general and specific aspects may be implemented using a system, a method, a computer program, a computer readable medium, or an apparatus or any combination of systems, methods, computer programs, computer readable mediums, and/or apparatuses While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and may be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, should may they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations for the purpose of streamlining the disclosure. This method of disclosure is not to be interpreted as reflecting an intention that the claimed implementations require more features than are expressly recited in each claim. Rather, as the following claims reflect, inventive subject matter lies in less than all features of a single disclosed implementation. Thus the following claims are hereby incorporated into the Detailed Description, with each claim standing on its own as a separately claimed subject matter.

What is claimed is:

1. A method comprising:
    establishing a connected state between a serving cell and a narrowband user equipment (UE) operated on a first set of narrowband RF subcarriers allocated by the serving cell for the UE;
    determining autonomously, by the UE, a first period of time to tune a narrowband RF transceiver included in the UE to a second set of narrowband RF subcarriers associated with a neighboring cell;
    while maintaining the connected state between the serving cell and the UE, tuning at a time according to the first period of time the narrowband RF transceiver to the second set of narrowband RF subcarriers and receiving first data from the neighboring cell via the second set of narrowband RF subcarriers;
    tuning, after receiving the first data from the neighboring cell, the narrowband RF transceiver to the first set of narrowband RF subcarriers allocated by the serving cell;
    obtaining a signal quality measurement for the received first data; and
    transmitting the signal quality measurement to the serving cell.

2. The method of claim 1, wherein the method further includes the UE determining a physical cell identity of the neighboring cell from a broadcast system information message, indicating that the neighboring cell supports Cat-M1.

3. The method of claim 1, wherein the second set of narrowband RF subcarriers comprises center six physical resource blocks (PRBs).

4. The method of claim 1, wherein the first data comprise cell-specific reference signals, primary synchronization signal, and secondary synchronization signal.

5. The method of claim 1, wherein the signal quality measurement comprises reference signal received power messages.

6. The method of claim 1, wherein the first set of narrowband RF subcarriers comprises six physical resource blocks, over which UE maintains the connected state with the serving cell.

7. The method of claim 1, wherein the first period of time to tune comprises immediately after the reception of a long repetition in the first set of allocated narrowband RF subcarriers.

8. The method of claim 1, wherein the first period of time to tune comprises after the completion of uplink/downlink grants via MTC Physical Dedicated Control Channel (MPDCCH) operations, Physical Uplink Shared Channel (PUSCH) operations and Physical Downlink Shared Channel (PDSCH) operations.

9. The method of claim 1, tangibly embodied as computer executable instructions on at least one non-transitory computer-readable medium.

10. An apparatus comprising:
at least one processor;
a narrowband radio frequency (RF) transceiver coupled to the at least one processor;
a memory coupled to the at least one processor, the memory storing instructions that when executed cause the at least one processor to:
establish a connected state between a serving cell and a narrowband user equipment (UE) operated on a first set of narrowband RF subcarriers allocated by the serving cell for the UE;
determine autonomously a first period of time to tune the narrowband RF transceiver to a second set of narrowband RF subcarriers that is different from the first set of narrowband RF subcarriers;
while the apparatus remains associated to the current cell, tune at a time according to the first period of time the narrowband RF transceiver to the second set of narrowband RF subcarriers and receiving first RF data from a neighboring base station via the second set of narrowband RF subcarriers;
tune, after receiving the first RF data from the neighboring cell, the narrowband RF transceiver to the first set of narrowband RF subcarriers allocated by the serving cell;
obtain signal quality measurement for the received first RF data; and
transmit the signal quality measurement to the serving cell.

11. The apparatus of claim 10, wherein the stored instructions further include instructions that when executed cause the at least one processor to determine a physical cell identity of the neighboring cell from a broadcast system information message, indicating that the neighboring cell supports Cat-M1.

12. The apparatus of claim 10, wherein the second set of narrowband RF subcarriers comprises center six physical resource blocks (PRBs).

13. The apparatus of claim 10, wherein the first data comprise a cell-specific reference signal, primary synchronization signal, and secondary synchronization signal.

14. The apparatus of claim 10, wherein the signal quality measurement comprises reference signal received power messages.

15. The apparatus of claim 10, wherein the first set of narrowband RF subcarriers comprises six physical resource blocks, over which the apparatus maintains the connected state with the serving cell.

16. The apparatus of claim 10, wherein the first period of time to tune comprises immediately after the reception of a long repetition in the first set of narrowband RF subcarriers.

17. The apparatus of claim 10, wherein the first period of time to tune comprises after the completion of uplink/downlink grants via MTC Physical Dedicated Control Channel (MPDCCH) operations, Physical Uplink Shared Channel (PUSCH) operations and Physical Downlink Shared Channel (PDSCH) operations.

18. A system for reduced signal quality measurement overhead comprising:
a serving mobile base station;
a plurality of neighboring mobile base stations adjacent to the serving mobile base station; and
a narrowband user equipment (UE), wherein the UE is associated with the serving mobile base station, wherein the UE is configured to:
establish a connected state between a serving cell and a narrowband user equipment (UE) operated on a first set of narrowband RF subcarriers allocated by the serving cell for the UE;
determine autonomously, by the UE, a first period of time to tune the narrowband RF transceiver to a second set of narrowband RF subcarriers associated with a neighboring base station selected from the plurality of neighboring mobile base stations;
while the UE remains associated to the serving base station, tune at a time associated with the first period of time the narrowband RF transceiver to the second set of narrowband RF subcarriers and receiving first data from the plurality of neighboring base stations via the second set of narrowband RF subcarriers;
tune, after receiving the first data from the neighboring mobile base station, the narrowband RF transceiver to the first set of narrowband RF subcarriers allocated by the serving cell;
obtain signal quality measurement for the received first data; and
transmit the signal quality measurement to the serving mobile base station.

19. The system of claim 18, wherein the UE is further configured to determine a physical cell identity of the neighboring mobile base station from a broadcast system information message, indicating that the neighboring mobile base station supports Cat-M1.

20. The system of claim 18, wherein the first period of time to tune comprises immediately after a reception of a long repetition in the narrowband subcarrier allocation.

* * * * *